US010856072B2

(12) United States Patent
Suzuki

(10) Patent No.: US 10,856,072 B2
(45) Date of Patent: Dec. 1, 2020

(54) AUDIO DEVICE, AUDIO CONTROL SYSTEM, AND AUDIO CONTROL METHOD

(71) Applicant: Yamaha Corporation, Hamamatsu (JP)

(72) Inventor: Kenji Suzuki, Hamamatsu (JP)

(73) Assignee: Yamaha Corporation, Hamamatsu (JP)

( * ) Notice: Subject to any disclaimer, the term of this patent is extended or adjusted under 35 U.S.C. 154(b) by 0 days.

(21) Appl. No.: 16/358,881

(22) Filed: Mar. 20, 2019

(65) Prior Publication Data

US 2019/0297417 A1 Sep. 26, 2019

(30) Foreign Application Priority Data

Mar. 22, 2018 (JP) ................................ 2018-054139

(51) Int. Cl.
*H03G 3/00* (2006.01)
*H04R 3/00* (2006.01)

(52) U.S. Cl.
CPC .......... *H04R 3/00* (2013.01); *H04R 2430/01* (2013.01)

(58) Field of Classification Search
CPC .......... H04R 3/00; H04R 3/002; H04R 3/007; H04R 3/02; H04R 3/04; H04R 3/06; H04R 3/08; H04R 2430/00; H04R 2430/01; H04R 1/02; H04R 1/025; H04R 27/00; H04R 2227/005; H03G 3/00; H03G 3/20; H03G 3/3005; H03G 3/3089; H03G 5/00; H03G 5/005; H03G 5/02; H03G 5/025; H03G 5/04; H03G 5/10; H03G 5/12; H03G 5/14
USPC ...... 381/100–110, 111, 116, 117, 77, 81–85, 381/86, 302, 118, 120, 123, 72, 73.1, 381/71.1–71.14; 700/94
See application file for complete search history.

(56) References Cited

U.S. PATENT DOCUMENTS

2001/0026624 A1* 10/2001 Kon ...................... H03G 3/001 381/104
2002/0141604 A1* 10/2002 Abe ........................ H04S 7/00 381/104
2005/0207594 A1* 9/2005 Uehara ................ H03G 3/3089 381/104
2006/0153403 A1* 7/2006 Lechner .................. H04R 3/00 381/102
2007/0290758 A1* 12/2007 Sakai .................... H03G 3/001 330/281
2008/0025520 A1* 1/2008 Sakai ....................... H04S 7/30 381/28
2008/0123873 A1* 5/2008 Bjorn-Josefsen ...... H03G 3/004 381/106
2009/0262965 A1* 10/2009 Steinbuss .............. H04R 25/70 381/314

(Continued)

FOREIGN PATENT DOCUMENTS

JP 2012-182639 A 9/2012

*Primary Examiner* — Leshui Zhang
(74) *Attorney, Agent, or Firm* — Crowell & Moring LLP

(57) ABSTRACT

An audio device includes a signal processor that processes an audio signal based on a predetermined parameter, a level adjuster that adjusts a level of the audio signal, a speaker that receives the audio signal and outputs sound, an interface that receives an instruction to switch the parameter, and a controller that decreases gain of the level adjuster when receiving the instruction to switch the parameter, and then performs gain control to increase the gain of the level adjuster so that a change amount of the gain of the level adjuster for a predetermined period of time is less than or equal to a predetermined value.

20 Claims, 12 Drawing Sheets

(56) References Cited

U.S. PATENT DOCUMENTS

2018/0349093 A1* 12/2018 McCarty ................ G06F 3/165

* cited by examiner

FIG.9

| Preset | EQ | | | Comp. | | |
|---|---|---|---|---|---|---|
| 1 | Gain | 50Hz | ··· | Gain | Thresh | ··· |
| | -3dB | -1dB | | -5dB | -1dB | |
| 2 | Gain | 50Hz | ··· | Gain | Thresh | ··· |
| | -1dB | -2dB | | -3dB | -3dB | |
| ⋮ | | | | | | |
| 10 | Gain | 50Hz | ··· | Gain | Thresh | ··· |
| | -4dB | -1dB | | -1dB | -3dB | |

AUDIO DEVICE, AUDIO CONTROL SYSTEM, AND AUDIO CONTROL METHOD

CROSS REFERENCE TO RELATED APPLICATIONS

This Nonprovisional application claims priority under 35 U.S.C. § 119 (a) on Patent Application No. 2018-054139 filed in Japan on Mar. 22, 2018 the entire contents of which are hereby incorporated by reference.

BACKGROUND OF THE INVENTION

1. Field of the Invention

A preferred embodiment of the present invention relates to an audio device that is able to receive an instruction to switch a parameter of a signal processor, and more particularly to a sound volume control of sound to be outputted.

2. Description of the Related Art

Japanese Unexamined Patent Application Publication No. 2012-182639 discloses an audio output device having a function of fixing sound volume, the audio output device preventing the sound volume from being drastically changed due to an unintended sound volume operation of a user after the sound volume is released from being fixed. The audio output device disclosed in Japanese Unexamined Patent Application Publication No. 2012-182639 includes two kinds of sound volume setting values of a hardware volume and a software volume in order to prevent the sound volume from being drastically changed, and gradually changes a difference in sound volume after the sound volume is released from being fixed.

However, Japanese Unexamined Patent Application Publication No. 2012-182639 does not disclose a method of controlling gain change of an amplifier, accompanied by the switching of a parameter of signal processing.

SUMMARY OF THE INVENTION

In view of the foregoing, a preferred embodiment of the present invention is directed to provide an audio device, an audio control system, and an audio control method that, in a case of receiving an instruction to switch a parameter, control a sound volume so as not to give a user an uncomfortable feeling about a change in sound volume before and after the parameter is switched.

An audio device according to a preferred embodiment of the present invention includes a signal processor that processes an audio signal based on a predetermined parameter, a level adjuster that adjusts a level of the audio signal, a speaker that receives the audio signal and outputs sound, an interface that receives an instruction to switch the parameter, and a controller that decreases gain of the level adjuster when receiving the instruction to switch the parameter, and then performs gain control to increase the gain of the level adjuster so that a change amount of the gain of the level adjuster for a predetermined period of time is less than or equal to a predetermined value.

According to a preferred embodiment of the present invention, even in a case in which an instruction to switch a parameter is received, sound volume is able to be controlled so as not to give a user an uncomfortable feeling about a change in sound volume before and after the parameter is switched.

The above and other elements, features, characteristics, and advantages of the present invention will become more apparent from the following detailed description of the preferred embodiments with reference to the attached drawings.

BRIEF DESCRIPTION OF THE DRAWINGS

FIG. 9 is a diagram illustrating a preset.

DETAILED DESCRIPTION OF THE PREFERRED EMBODIMENTS

Figure 1:
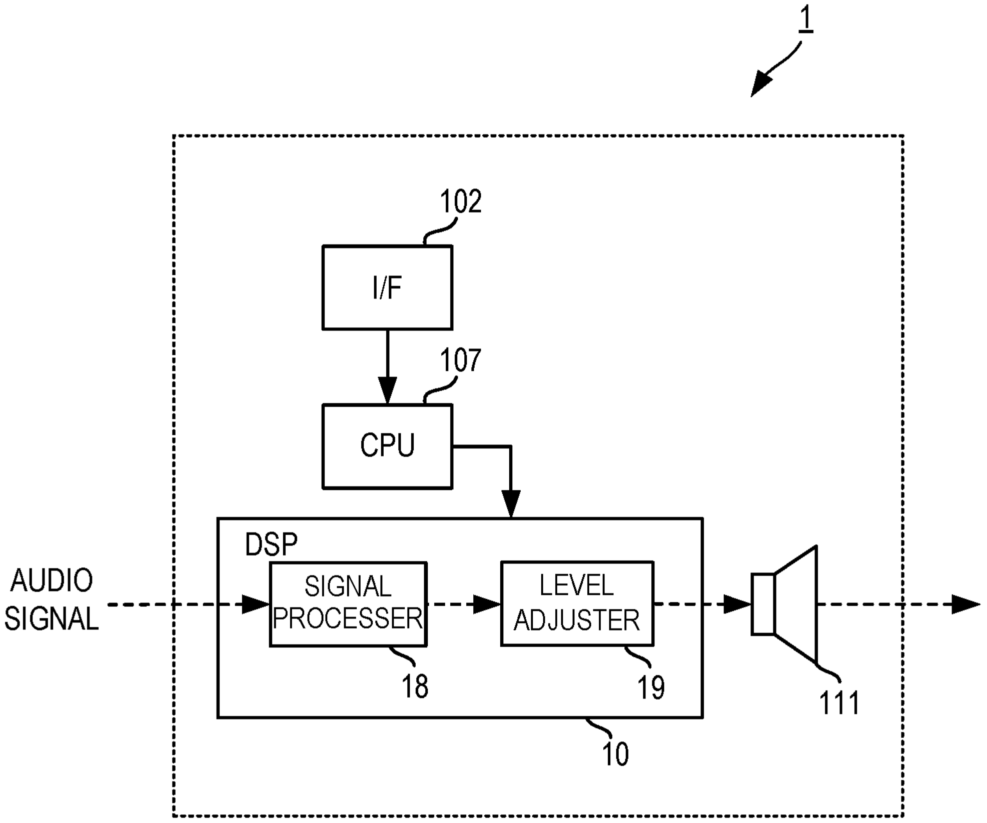
FIG. 1 is a block diagram showing a configuration of an audio device according to a first preferred embodiment of the present invention.

In FIG. 1, a flow of an audio signal is indicated by a dashed line.

As shown in FIG. 1, an audio device 1 includes a hardware configuration including a CPU 107, an interface (I/F) 102, a DSP (Digital Signal Processor) 10, and a speaker unit 111. The DSP 10 includes a functional configuration including a signal processor 18 and a level adjuster 19. The CPU 107 is connected to the I/F 102 and the DSP 10. The level adjuster 19 is connected to the signal processor 18 and the speaker unit 111. It is to be noted that the speaker unit 111 is an example of a "speaker" according to the present invention and the CPU 107 is an example of a "controller" according to the present invention.

The CPU 107 reads a program stored in a not-shown memory that is a storage medium, and implements a predetermined function.

The I/F 102 includes a switch, a knob, or a touch panel provided, for example, at a portion of a housing of the audio device 1 and receives an operation from a user. The I/F 102 is an example of an "interface" according to the present invention. A user instructs switching of a preset through the I/F 102.

The preset refers to a parameter of signal processing such as mixing, equalizing, or compressing, the parameter being specified beforehand by the DSP 10. The preset includes a plurality of presets that are set beforehand and are stored in a not-shown memory in the audio device 1. The user can easily instruct switching of a parameter based on switching of a preset by selecting any one from the plurality of presets. For example, as shown in FIG. 9, in Preset 1, the parameter of equalizing and the parameter of compressing are specified. In Preset 1, the total gain of equalizing is set to −3 dB, and the gain at a frequency of 50 Hz is specified as −1 dB. In addition, in Preset 1, the total gain of compressing is set to −5 dB, and a threshold is specified as −1 dB. In Preset 2, the total gain of equalizing is set to −1 dB, and the gain at a frequency of 50 Hz is specified as −2 dB. In addition, in Preset 2, the total gain of compressing is set to −3 dB, and a threshold is specified as −3 dB. When a user selects Preset 1, the parameter of the DSP 10 is set to the parameter of Preset 1. In other words, the total gain of equalizing is set to −3 dB, and the gain at a frequency of 50 Hz is set to −1 dB. The total gain of compressing is set to −5 dB, and a threshold is set to −1 dB. When a user selects Preset 2, the parameter of the DSP 10 is switched to the parameter of Preset 2. In other words, the total gain of equalizing is set to −1 dB, and the gain at a frequency of 50 Hz is switched to −2 dB. In addition, the total gain of compressing is set to −3 dB, and the threshold is switched to −3 dB. In this manner, the user can easily switch a parameter by selecting a preset.

The signal processor 18 processes an audio signal that has been inputted from the outside of the audio device 1 based on the parameter of a predetermined preset. The signal processor 18 performs processing such as mixing, equalizing, or compressing, for example, on the audio signal. The CPU 107 determines a coefficient of the DSP 10 required for performing signal processing based on the parameter of the preset. The signal processor 18 performs the processing on the audio signal according to the coefficient that the CPU 107 determines. The signal processor 18 outputs the signal-processed audio signal to the level adjuster 19.

The level adjuster 19 adjusts the level of the audio signal on which the signal processing has been performed by the signal processor 18 based on the instruction of the CPU 107. The level adjuster 19 outputs a level-adjusted audio signal to the speaker unit 111. The speaker unit 111 inputs the audio signal that has been outputted from the level adjuster 19, and outputs sound. It is to be noted that the level adjuster 19 may be disposed in a stage preceding the signal processor 18.

The CPU 107 receives an instruction to switch a preset through the I/F 102. The CPU 107, when receiving the instruction to switch a preset, switches the parameter that is currently set to the DSP 10 to the parameter of a new preset. The CPU 107, when receiving the instruction to switch a preset, performs control to adjust a gain of the level adjuster 19. It is to be noted that the CPU 107 may receive an instruction to switch one or a plurality of parameters through the I/F 102. In this case as well, the CPU 107 switches the parameter that is currently set to the DSP 10 to a new parameter. In addition, the CPU 107 adjusts the gain of the level adjuster 19.

Subsequently, a control method in which the CPU 107 adjusts a gain of the level adjuster 19, that is, an audio control method will be described with reference to the graph of FIG. 2 and the flow chart of FIG. 3.

Figure 2:
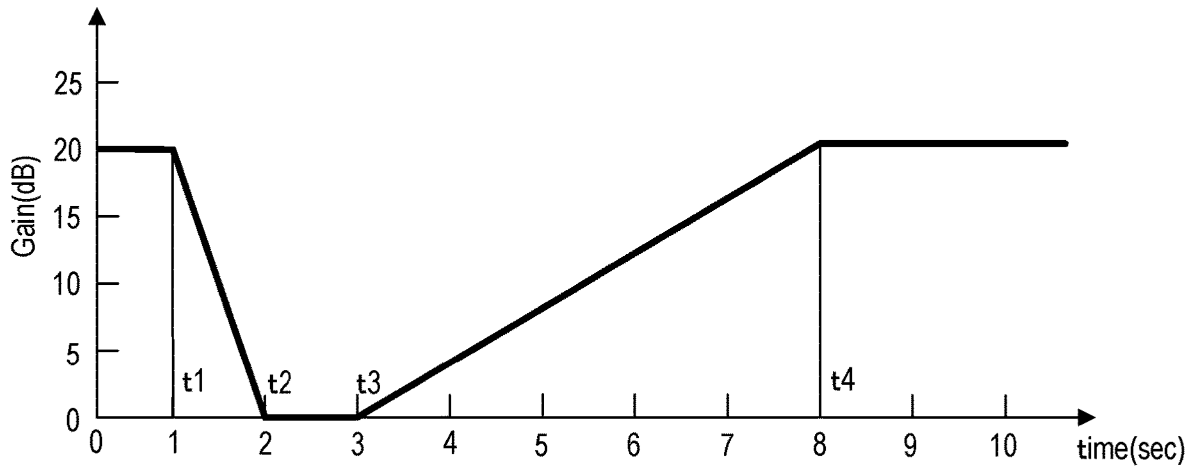
FIG. 2 illustrates a first example of a gain changing operation according to the first preferred embodiment of the present invention.

FIG. 2 illustrates a first example of a gain changing operation according to the first preferred embodiment of the present invention. The horizontal axis of the graph in FIG. 2 indicates time (the unit is sec: second). The vertical axis indicates gain (the unit is dB) in the level adjuster 19. A thick solid line in the graph indicates a change in gain. It is to be noted that the gain in FIG. 2 is based on the minimum value of 0 dB for the purpose of description, and the minimum value is assumed to correspond to an almost silent state.

Figure 3:
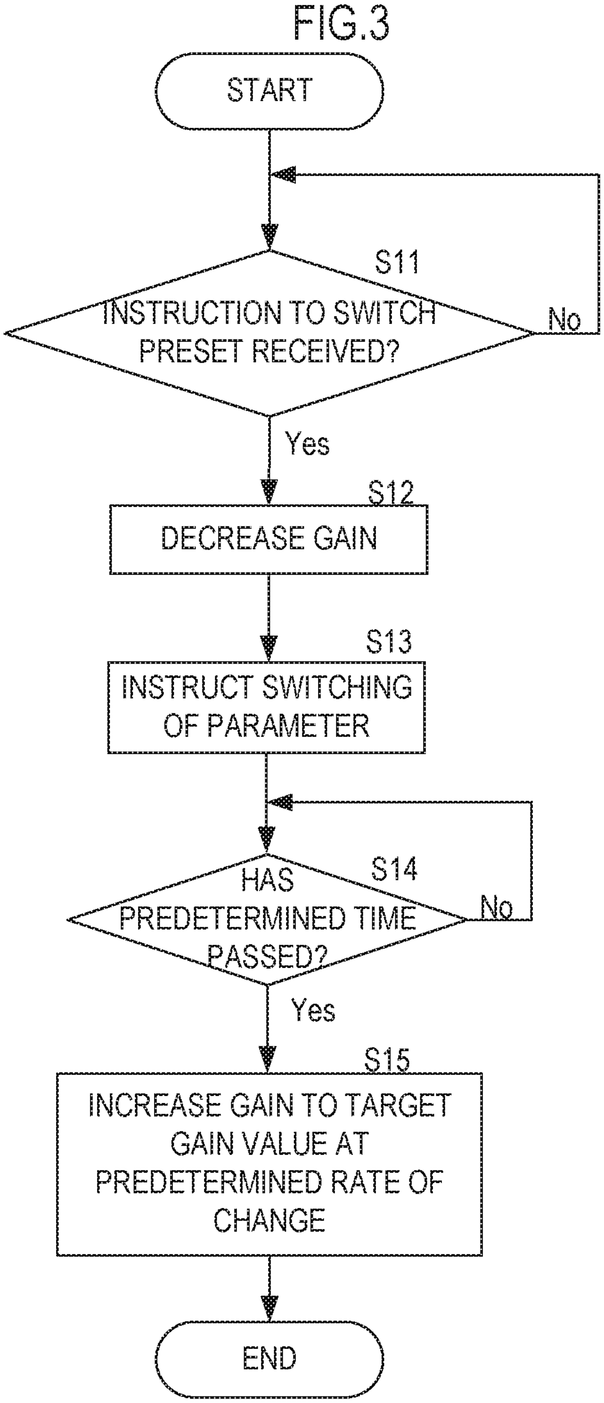
FIG. 3 is a flow chart showing an operation of the audio device according to the first preferred embodiment of the present invention.

FIG. 3 is a flow chart showing an operation of the audio device 1 according to the first preferred embodiment of the present invention.

First, the CPU 107 determines whether or not to receive an instruction to switch a preset through the I/F 102 (s11). The CPU 107, in a case of having received the instruction to switch a preset (Yes in s11), decreases the gain of the level adjuster 19 (s12). The level adjuster 19 receives the audio signal that has been processed by the signal processor 18, and performs level adjustment so as to decrease gain. The CPU 107, in a case of receiving no instructions to switch a preset (No in s11), maintains the gain of the level adjuster 19 as it is.

As shown in the graph of FIG. 2, the CPU 107, for example, receives the instruction to switch a preset at a timing t1. The CPU 107 decreases the gain of the level adjuster 19 so that the gain may be set to 0 dB. In the example of FIG. 2, the CPU 107, from the timing t1 to a timing t2, decreases the gain from 20 dB to 0 dB. In other words, the CPU 107 decreases the gain at a rate of change of −20 dB per second.

Then, the CPU 107 maintains the gain of the level adjuster 19 at 0 dB until a predetermined time (1 second in the example of FIG. 2) passes and time reaches a timing t3. The CPU 107, from the timing t2 to the timing t3, switches the parameter that is currently set to the signal processor 18 to the parameter of a new preset (s13). The length of time between the timing t2 and the timing t3 is set to be sufficiently longer than time required for switching of the preset of the signal processor 18. Accordingly, the audio device 1 does not generate unintended sound at a time of switching of a preset.

When the predetermined time passes and time reaches the timing t3 (Yes in s14), the CPU 107 increases the gain of the level adjuster 19 to a target gain value at a predetermined rate of change (s15). In addition, the predetermined time passes and time has not reached the timing t3 (No in s14), the CPU 107 maintains the gain of the level adjuster 19 at 0 dB.

In the present preferred embodiment, the rate of change refers to a change amount of gain per unit time. The predetermined rate of change is +4 dB per second in the example of FIG. 2. The CPU 107 increases the gain of the level adjuster 19 so that the change amount of the gain of the level adjuster 19 for a predetermined period of time may be less than or equal to a predetermined value. For example, the CPU 107 increases the gain by +20 dB over 5 seconds from the timing t3 to a timing t4 in FIG. 2. Accordingly, the change amount per unit time may be a value smaller than +20 dB. In other words, the CPU 107 makes the absolute value of a rate of change when increasing the gain smaller than the absolute value of a rate of change when decreasing the gain. Therefore, the sound volume from the timing t3 to the timing t4 changes gradually. As a result, the volume of sound to be outputted from the speaker unit 111 changes gradually. Accordingly, the audio device 1, even when receiving the instruction to switch a preset, prevents a drastic change in sound volume from occurring and is able to increase the current sound volume to a predetermined sound volume without giving a user an uncomfortable feeling in the auditory sense of the user.

Figure 4:
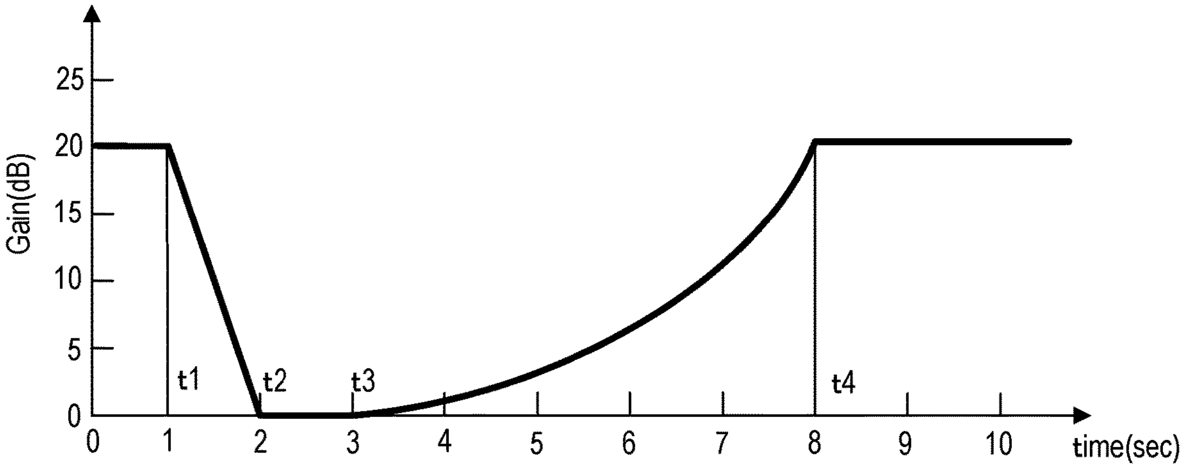
FIG. 4 illustrates a modification example of the gain changing operation.
Figure 5:
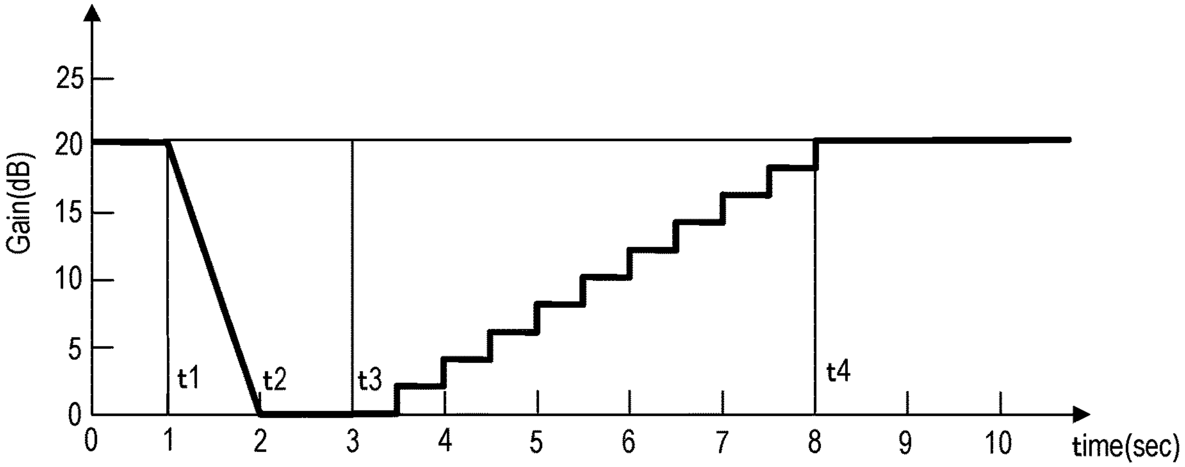
FIG. 5 illustrates a modification example of the gain changing operation.
Figure 6:
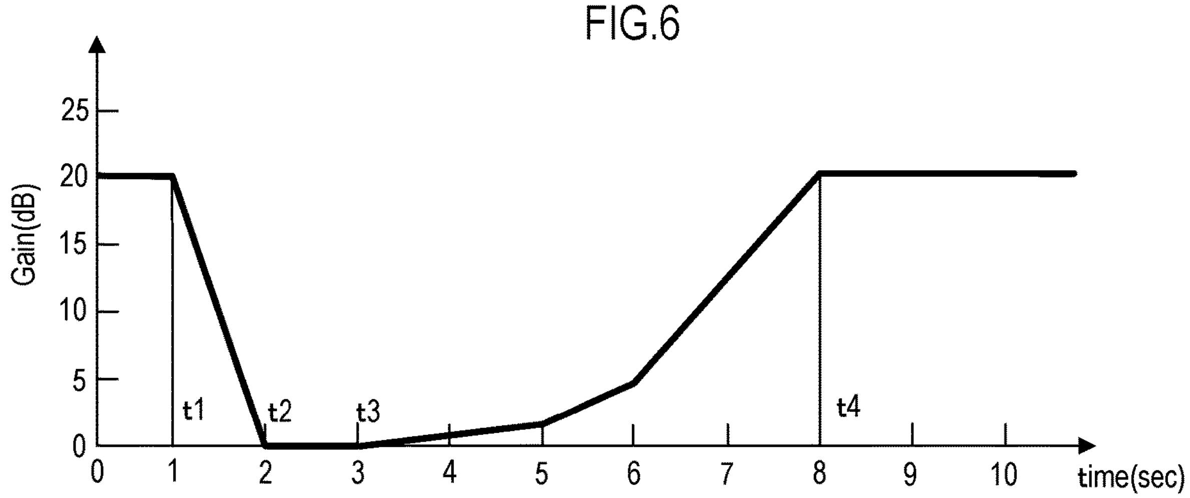
FIG. 6 illustrates a modification example of the gain changing operation.

It is to be noted that a variation mode of gain is able to be set as long as a drastic change in sound volume does not occur when switching of a parameter is performed. For example, a modification example of a gain changing operation as shown below may be given. FIG. 4, FIG. 5, and FIG. 6 illustrate a modification example of the gain changing operation.

The gain changing operation is not limited to the example of changing to a linear shape as shown in FIG. 2. The gain changing operation may be performed as long as the rate of change of the gain is less than or equal to a predetermined value. For example, even in the gain changing operations as shown in FIG. 4, FIG. 5, and FIG. 6, since the gain of the level adjuster 19 changes from 0 to 4 for a period of time from the timing t3 to the timing t4, the advantageous effects similar to the effects of the first preferred embodiment are able to be obtained.

As shown in FIG. 4, the variation mode of gain may be varied in a curved line. In other words, the rate of change of gain may not be constant. In such a case, the CPU 107 increases the gain of the level adjuster 19 slowly so that a change in sound volume may not be noticeable when the absolute value of the sound volume is small, and then increases the gain of the level adjuster 19 promptly as the gain of the level adjuster 19 is increased. Accordingly, even in a situation (in a case in which the absolute value of the sound volume is small) in which a change in sound volume is noticeable, the audio device 1 is able to make the change of sound volume unnoticeable and, in a situation (in a case in which the absolute value of the sound volume is large) in which the change in sound volume is unnoticeable, is able to increase the gain of the level adjuster 19 promptly.

As shown in FIG. 5, the gain changing operation may increase the gain of the level adjuster 19 gradually in a predetermined period of time. In a case shown in FIG. 5, the CPU 107 changes gain so that the gain of the level adjuster 19 for a predetermined period of time may be increased by 2 dB every 0.5 seconds. The CPU 107 is also able to perform such a gain changing operation. In this case as well, the CPU 107 increases the gain of the level adjuster 19 so that the change amount of the gain of the level adjuster 19 for a predetermined period of time (5 seconds, for example) may be less than or equal to a predetermined value (20 dB, for example).

As shown in FIG. 6, the gain changing operation may change the rate of change of the gain of the level adjuster 19 for a predetermined period of time. In a case shown in FIG. 6, the rate of change of the gain of the level adjuster 19 is +1.25 dB per second until after 2 seconds from the timing t3, +2.5 dB per second during the following 1 second, and +7.5 dB per second during the further following 2 seconds. In the case shown in FIG. 6 as well as a case shown in FIG. 4, the CPU 107 increases the gain of the level adjuster 19 slowly so that a change in sound volume may not be noticeable when the absolute value of the sound volume is small, and then increases the gain of the level adjuster 19 promptly after the sound volume reaches a certain level of sound volume. Accordingly, the audio device 1, even in a situation (in a case in which the absolute value of the sound volume is small) in which a change in sound volume is noticeable, is able to make the change of sound volume unnoticeable, and, in a situation (in a case in which the absolute value of the sound volume is large) in which the change in sound volume is unnoticeable, is able to increase the gain of the level adjuster 19 promptly.

Figure 7:
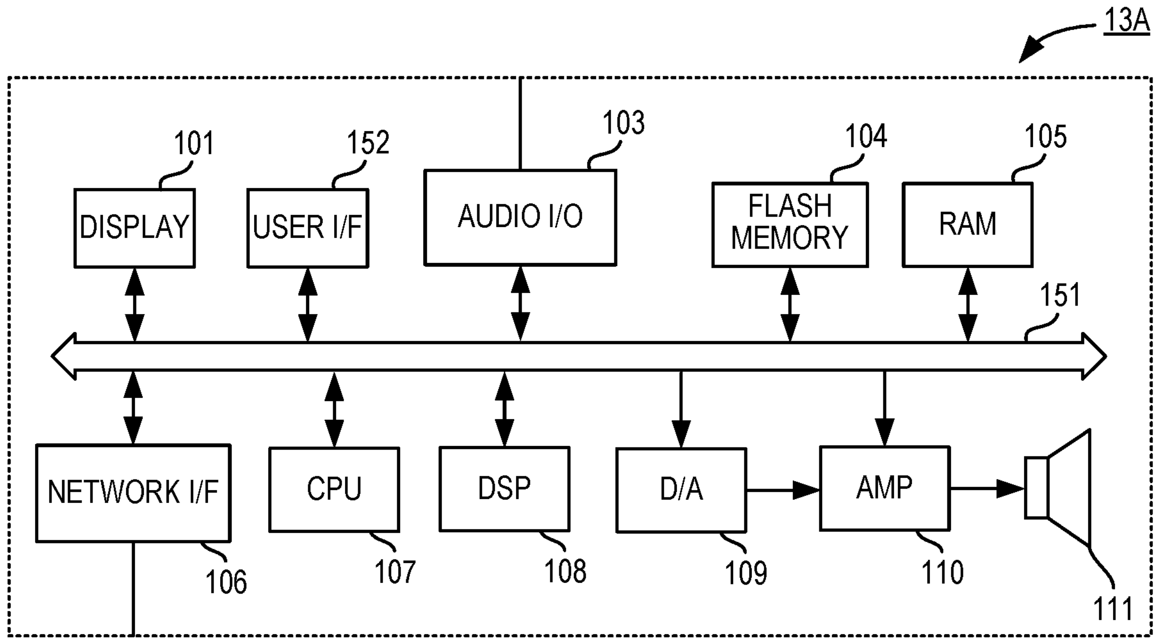
FIG. 7 is a block diagram showing a configuration of an example of the audio device according to the first preferred embodiment of the present invention.
Figure 8:
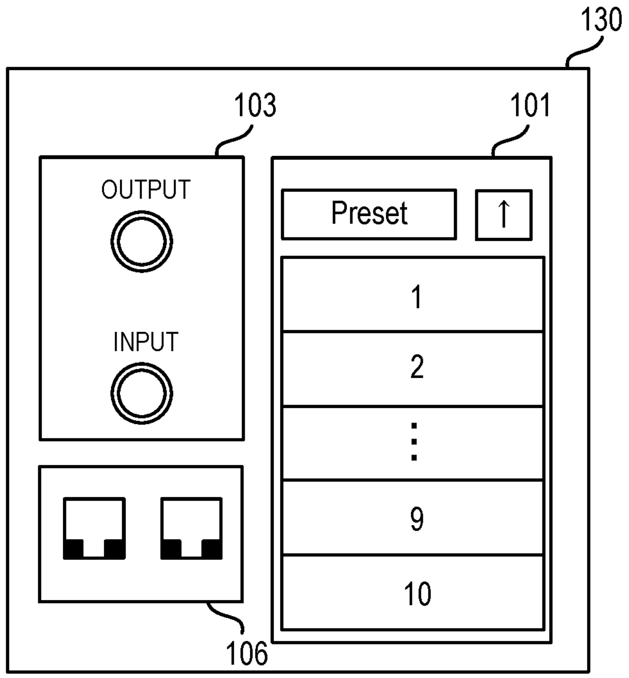
FIG. 8 is a view showing an example of an exterior appearance of a display, an audio I/O, and a network I/F of an audio device according to the first preferred embodiment of the present invention.

Subsequently, an example of the audio device 1 is described. FIG. 7 is a block diagram showing a configuration of a speaker of an example of the audio device 1. A speaker 13A shown in FIG. 7 is an example of the "audio device" of the present invention. It is to be noted that a description of a configuration as the audio device 1 will be omitted. FIG. 8 is a view showing an example of an exterior appearance of a display of the speaker 13A, an audio I/O, and a network I/F. FIG. 9 is a diagram illustrating a preset.

As shown in FIG. 7, the speaker 13A includes a display 101, a user interface (I/F) 152, an audio I/O (Input/Output) 103, a flash memory 104, a RAM 105, a network interface (I/F) 106, a CPU 107, a DSP 108, a D/A converter 109, an amplifier 110, and a speaker unit 111. The display 101, the user I/F 152, the audio I/O 103, the flash memory 104, the RAM 105, the network interface (I/F) 106, the CPU 107, the DSP 108, the D/A converter 109, and the amplifier 110 are connected to a bus 151. The amplifier 110 is connected to the D/A converter 109 and the speaker unit 111. It is to be noted that the user I/F 152 is an example of the "interface" in the present invention, the DSP 108 is an example of the "signal processor" in the present invention, and the amplifier 110 is an example of the "level adjuster" in the present invention.

As shown in FIG. 8, the display 101, the audio I/O 103, and the network I/F 106 are provided at a portion of a housing 130 of the speaker 13A. The display 101 includes an LCD (Liquid Crystal Display) or an OLED (Organic Light-Emitting Diode), for example, and displays various types of information. The user I/F 152 includes a switch, a knob, or a touch panel, and receives an operation from a user. In the example of FIG. 8, the user I/F 152 is a touch panel. Therefore, the user I/F 152 constitutes GUI (Graphical User Interface) together with the display 101.

The DSP 108 performs signal processing on an audio signal to be inputted through the audio I/O 103 or the network I/F 106. The DSP 108 outputs the signal-processed audio signal to the amplifier 110. It is to be noted that the DSP 108 may send the audio signal of the amplifier 110 through the D/A converter 109.

The CPU 107 sets a parameter based on a preset as shown in FIG. 9 to the DSP 108. A plurality of presets are set beforehand and stored in the flash memory 104. In the present preferred embodiment, 10 presets from 1 to 10 are set beforehand. Accordingly, a user can easily switch a parameter by selecting any one of the 10 presets.

The CPU 107 reads the program stored in the flash memory 104 being a storage medium to the RAM 105 and implements a predetermined function. The CPU 107 displays an image for receiving an operation from the user on the display 101, and, by receiving an operation such as a selection operation to the image through the user I/F 152, implements a GUI. For example, as shown in FIG. 8, the CPU 107 displays selection buttons (1-10) of the presets on the display 101. The user can select any one of the presets from the selection buttons (1-10) of the presets. In addition, the CPU 107 may receive an instruction to switch a preset through the network I/F 106.

The CPU 107, when receiving the instruction to switch a preset, reads a parameter based on the selected preset from the flash memory 104. The CPU 107 switches the parameter that is currently set to the DSP 108 to the parameter of a new preset. The CPU 107, when receiving the instruction to switch a preset, adjusts the gain of the amplifier 110 and performs volume control.

It is to be noted that the program that the CPU 107 reads does not need to be stored in the flash memory 104 in a self-device. For example, the program may be stored in a storage medium of an external device such as a server. In such a case, the CPU 107 may read the program each time from the server to the RAM 105 and may execute the program.

Subsequently, an audio control system according to a second preferred embodiment will be described. It is to be noted that, in a description of the audio control system according to the second preferred embodiment, a description of the same configuration as the audio device according to the first preferred embodiment will be omitted.

Figure 10:
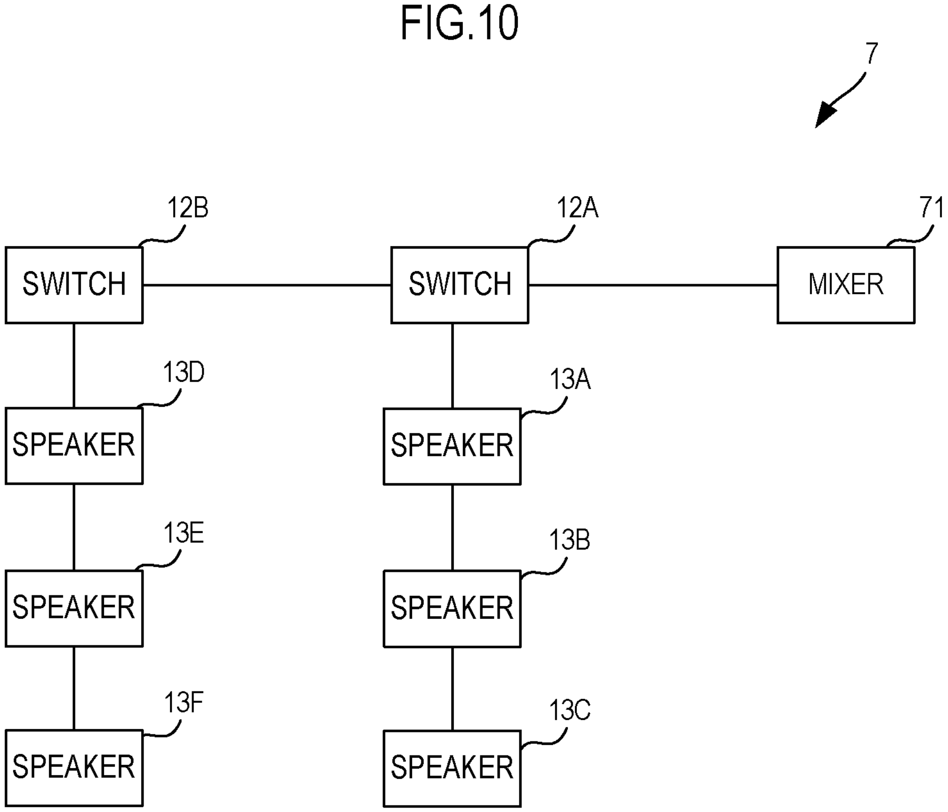
FIG. 10 is a diagram showing a configuration of an audio control system according to a second preferred embodiment of the present invention.

FIG. 10 is a diagram showing a configuration of the audio control system according to the second preferred embodiment of the present invention. An audio control system 7 includes components such as a mixer 71, a plurality of switches (a switch 12A and a switch 12B), and a plurality of speakers (a speaker 13A to a speaker 13F). Since the speaker 13A to the speaker 13F have substantially the same configuration as one another, the speaker 13A will be described as a representative example.

The components are connected to each other through a network cable. For example, the mixer 71 is connected to the switch 12A. The switch 12A is connected to the switch 12B and the speaker 13A. The switch 12B is connected to the switch 12A and the speaker 13D. The speaker 13A, the speaker 13B, and the speaker 13C are connected to the switch 12A in a daisy chain. In addition, the speaker 13D, the speaker 13E, and the speaker 13F are also connected to the switch 12B in a daisy chain. The mixer 71 receives an audio signal from other devices connected in the network or outputs an audio signal to other devices.

Figure 11:
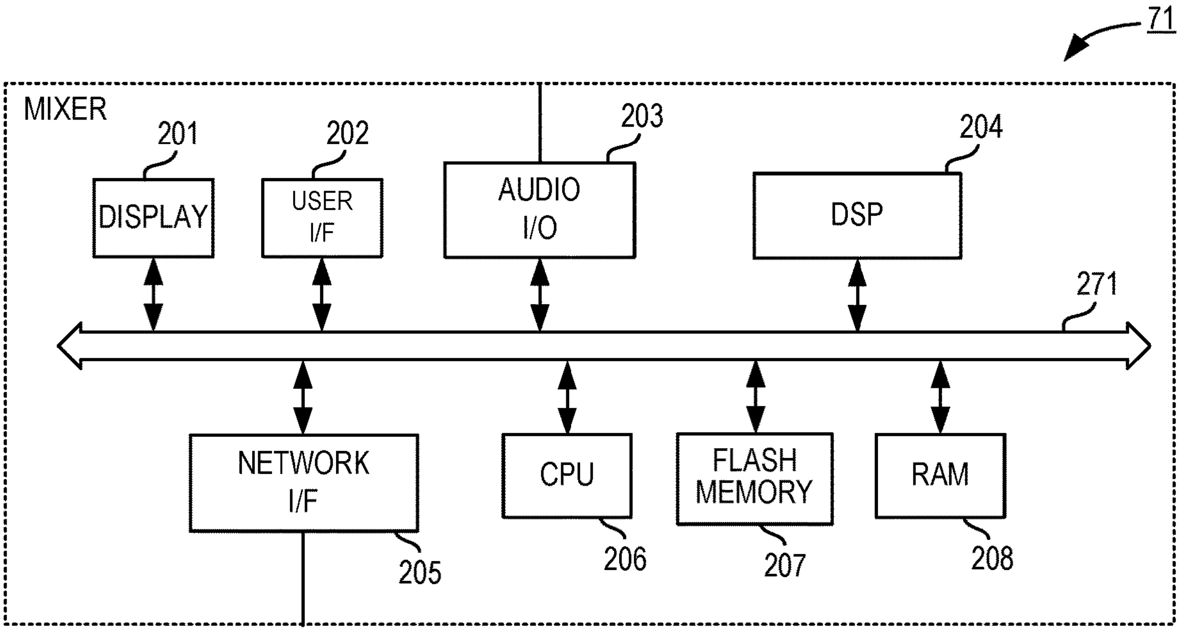
FIG. 11 is a block diagram showing a configuration of a mixer of the audio control system according to the second preferred embodiment of the present invention.

FIG. 11 is a block diagram showing a configuration of the mixer 71. As shown in FIG. 11, the mixer 71 sends an audio signal to the speaker 13A to the speaker 13F that are connected through the network. In addition, the mixer 71 issues an instruction to switch a preset.

The mixer 71 includes components such as a display 201, a user I/F 202, an audio I/O (Input/Output) 203, a digital signal processor (DSP) 204, a network I/F 205, a CPU 206, a flash memory 207, and a RAM 208. These components are connected to each other through a bus 271.

The CPU 206 is a controller that controls the operation of the mixer 71. The CPU 206 reads and implements a predetermined program stored in the flash memory 207 being a storage medium to the RAM 208 and performs various types of operations. For example, the CPU 206 outputs an instruction to switch a preset, to each of the speaker 13A to the speaker 13F.

It is to be noted that the program that the CPU 206 reads does not also need to be stored in the flash memory 207 in the self-device. For example, the program may be stored in a storage medium of an external device such as a server. In such a case, the CPU 206 may read the program each time from the server to the RAM 208 and may execute the program.

The digital signal processor 204 includes a DSP to perform various types of signal processing. The digital signal processor 204 performs signal processing such as mixing, equalizing, or compressing, on an audio signal to be inputted through the audio I/O 203 or the network I/F 205. The digital signal processor 204 outputs the signal-processed audio signal to other devices such as the speaker 13A, through the audio I/O 203 or the network I/F 205.

A user inputs an instruction to switch a preset of the speaker 13A to the speaker 13F to the mixer 71 through the user I/F 202. The CPU 206 sends the instruction to switch a preset received through the user I/F 202 to the speaker 13A to the speaker 13F through the network I/F 205. Each of the speaker 13A to the speaker 13F receives the instruction to switch a preset through the network I/F 106. In this manner, in the audio control system 7, a plurality of audio devices (the speaker 13A to the speaker 13F) receive an instruction to switch a preset through a network.

Figure 12A:
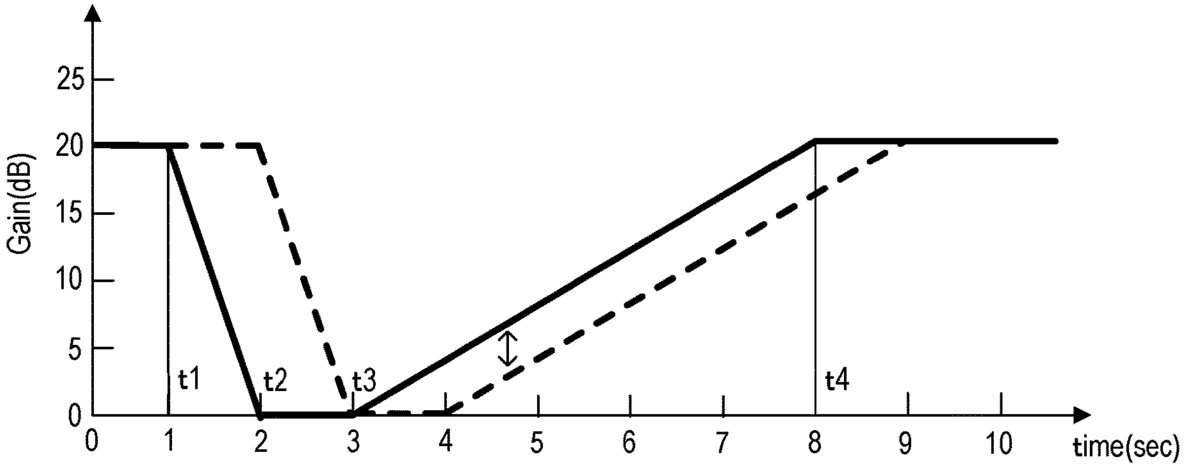
FIG. 12A illustrates a second example of a gain changing operation according to the second preferred embodiment of the present invention.
Figure 12B:
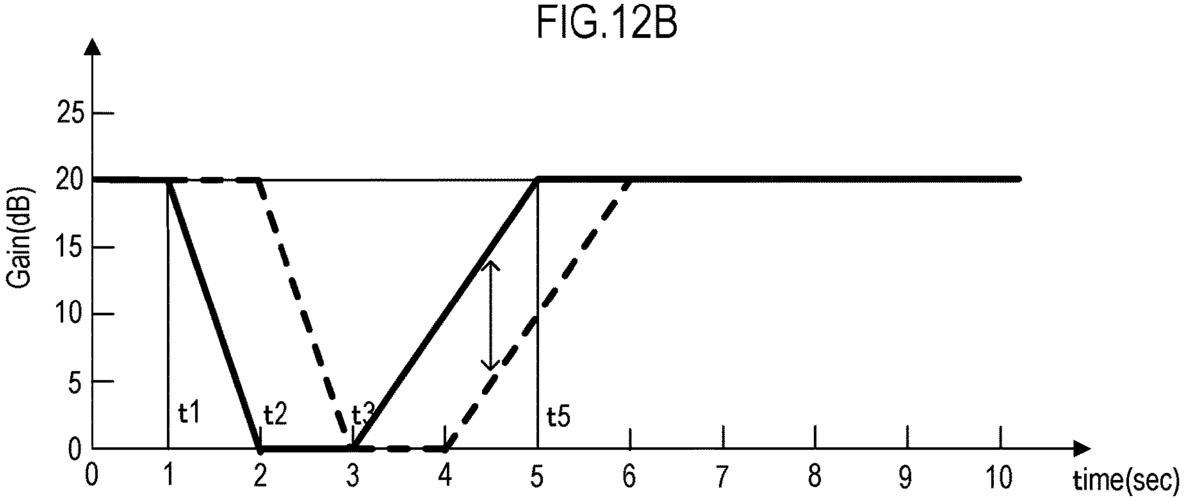
FIG. 12B illustrates a conventional reference example.

Subsequently, a gain changing operation in a case in which an instruction to switch a preset is issued at the speaker 13A to the speaker 13F will be described. FIG. 12A illustrates a second example of a gain changing operation according to the second preferred embodiment of the present invention. FIG. 12B illustrates a conventional reference example. In FIG. 12A, the gain of the speaker 13A is indicated by a solid line, and the gain of the speaker 13B is indicated by a dashed line. It is to be noted that, in FIG. 12A, the speaker 13A and the speaker 13B are described as representatives for the sake of convenience.

In a case in which an instruction to switch a preset is issued through a network to a plurality of audio devices, the DSP 108 of each of the speakers may receive an instruction to switch a preset at different timing due to a difference in network load. For example, in a case in which a communication load in a network is high, timing when an instruction to switch a preset is received is delayed. In addition, time required for switching a parameter may differ due to a load of the DSP 108 of each of the speakers. For example, in a case in which the DSP 108 performs a large number of types of effect processing and also performs complicated signal processing, the time required from when an instruction to switch a preset to when switching of a parameter is actually performed takes longer.

As shown in FIG. 12B, in the conventional reference example, the gain of the amplifier of each of the speakers is increased so that the change amount of the gain of the amplifier for a predetermined period of time may be larger than a predetermined value. In the reference example of FIG. 12B, the gain is increased by 20 dB in 2 seconds. In this manner, when the gain of the amplifier is increased drastically, in a case in which timing when an instruction to switch a preset is received greatly differs between a speaker with a high network load and a speaker with a low network load, a difference in sound volume between the speakers is increased. In addition, in this manner, when the gain of the amplifier is increased drastically, even between a speaker with a high load of the signal processor and a speaker with a low load of the signal processor, the difference in sound volume between the speakers is increased. For example, in FIG. 12B, since a difference in time until the gain is increased is 1 second, a difference in sound volume of 10 dB occurs between speakers.

In contrast, in the audio control system 7 according to the present preferred embodiment, in a case in which an instruction to switch a preset is issued, the CPU 107 of each of the speakers (the speaker 13A to the speaker 13F) increases the gain of each of the speakers to a target gain value so that the change amount of the gain of the amplifier 110 for a predetermined period of time may be less than or equal to a predetermined value. In the example of FIG. 12A, the CPU 107 increases the gain by 20 dB over 5 seconds. In this manner, in a case in which the gain of the amplifier is increased gradually, in a case in which timing when an instruction to switch a preset is received differs greatly due to a difference in network load, or even in a case in which time required until switching of a parameter is actually performed differs due to a difference in load of the signal processor, the difference in sound volume between the speakers is small. For example, in FIG. 12A, although the difference in time until the gain is increased is 1 second, the difference in sound volume between the speakers is only about 4 dB.

As shown in the graph of FIG. 12A, the CPU 107 of the speaker 13A, for example, from the timing t3 to the timing t4, increases the gain of the amplifier 110 of the speaker 13A from 0 dB to 4 dB gradually with +4 dB per second. In addition, the CPU 107 of the speaker 13B increases the gain of the amplifier 110 of the speaker 13B with +4 dB per second.

As with FIG. 12A, in a case in which the timing when an instruction to switch a preset in the speaker 13B is received is 1 second delayed from the timing of the speaker 13A, the difference in gain of the amplifier 110 of the speaker 13A and the speaker 13B is less than or equal to 4 dB even at any elapsed time from the timing t3 to the timing t4. In contrast, in a case in which the rate of change of the gain of the amplifier is +10 dB per second in the conventional reference example, the difference in gain between the speakers of which the timing when an instruction to switch a preset is received differs by 1 second is about 10 dB also at any elapsed time. In this manner, even in a case in which a plurality of speakers receive an instruction to switch a preset through a network, by a gradual increase of the gain of the amplifier 110 of each of the speakers at a constant rate of change, the audio control system 7 of the present preferred embodiment is able to reduce the difference in gain of the amplifier 110 of each of the speakers. In other words, the audio control system 7, even in a case of receiving an instruction to switch a preset, is able to reduce the difference in sound volume between each of the speakers before and after the preset is switched. Accordingly, the audio control system 7, even in a case of receiving the instruction to switch a preset, is able to control sound volume so as not to give a user an uncomfortable feeling about a change in sound volume in each of the speakers.

In addition, in the audio control system 7, the gain of the amplifier 110 of each of the speakers may preferably be linearly increased at a constant rate of change. By an increase of the gain of the amplifier 110 of each of the speakers at a constant rate of change in audio control system 7, the difference in gain of the amplifier 110 of each of the speakers is approximately constantly maintained. For example, in the example of FIG. 12A, the difference in gain of the amplifier 110 between the speakers is 4 dB also at any elapsed time from 1 second after the timing t3 to the timing t4. Accordingly, the audio control system 7 is able to make the difference in gain of the amplifier 110 of each of the speakers constant to some extent. Since, in the audio control system 7, the difference in sound volume in sound outputted from each of the speakers is constant to some extent, a user can hardly recognize the difference in change in sound volume between each of the speakers. Accordingly, the audio control system 7, even in a case of receiving the instruction to switch a preset, is able to control sound volume so as not to give a user an uncomfortable feeling about a change in sound volume in each of the speakers.

The foregoing preferred embodiments are illustrative in all points and should not be construed to limit the present invention. The scope of the present invention is defined not by the foregoing preferred embodiment but by the following claims. Further, the scope of the present invention is intended to include all modifications within the scopes of the claims and within the meanings and scopes of equivalents.

What is claimed is:

1. An audio device comprising:

a signal processor that processes an audio signal to produce a processed audio signal based on a parameter;

a level adjuster that adjusts a gain of the processed audio signal corresponding to a gain of the level adjuster to produce a gain adjusted and processed audio signal;

a speaker that outputs the gain adjusted and processed audio signal;

an interface that receives an instruction to switch the parameter; and a controller that performs:

decreasing, using the level adjuster during a first time period before switching the parameter, the gain of the level adjuster;

switching, during a second time period, the parameter according to the instruction received by the interface; and increasing, using the level adjuster, the gain of the level adjuster with the switched parameter during a third time period after the second time period so that a change amount of the gain of the level adjuster for the third time period is less than or equal to a predetermined value.

2. The audio device according to claim 1, wherein the interface receives the instruction to switch the parameter through a network.

3. The audio device according to claim 1, wherein the change amount of the gain of the level adjuster for the third time period is constant.

4. The audio device according to claim 1, wherein the parameter to be switched in the instruction received by the interface is specified beforehand in a preset.

5. An audio control system comprising:

a plurality of audio devices according to claim 1.

6. The audio device according to claim 1, wherein the controller switches the parameter during the second time period having a duration at least as long as a switching time required for switching a preset specifying the parameter.

7. The audio device according to claim 6, wherein the preset specifies a plurality of parameters including the parameter for one or more of mixing, compressing, and equalizing of the audio signal.

8. The audio device according to claim 1, wherein the controller decreases the gain of the level adjuster in response to receiving the instruction from the interface.

9. The audio device according to claim 1, wherein the controller decreases the gain of the level adjuster to a silent or almost silent state.

10. The audio device according to claim 1, wherein:

the controller decreases the gain of the level adjuster at a first rate; and the absolute value of the first rate is less than the absolute value of the change amount of the gain of the level adjuster for the third time period.

11. The audio device according to claim 1, wherein the signal processor processes the audio signal based on a coefficient determined by the controller based on the parameter of a preset.

12. An audio control method comprising:

processing an audio signal to produce a processed audio signal based on a parameter;

adjusting a gain of the processed audio signal at a level adjuster, corresponding to a gain of the level adjuster, to produce a gain adjusted and processed audio signal;

outputting the gain adjusted and processed audio signal;

receiving an instruction to switch the parameter by an interface; and decreasing, using the level adjuster during a first time period before switching the parameter, the gain of the level adjuster;

switching, during a second time period, the parameter according to the instruction received by the interface; and increasing, using the level adjuster, the gain of the level adjuster with the switched parameter during a third time period after the second time period so that a change amount of the gain of the level adjuster for the third time period is less than or equal to a predetermined value.

13. The audio control method according to claim 12, wherein the receiving the instruction to switch the parameter is performed through a network.

14. The audio control method according to claim 12, wherein the change amount of the gain of the level adjuster in the third time period is constant.

15. The audio control method according to claim 12, wherein the parameter to be switched in the instruction received by the interface is specified beforehand in a preset.

16. The audio control method according to claim 12, wherein the parameter is switched during the second time period having a duration at least as long as a switching time required for switching a preset specifying the parameter.

17. The audio control method according to claim 16, wherein the preset specifies a plurality of parameters including the parameter for one or more of mixing, compressing, and equalizing of the audio signal.

18. The audio control method according to claim 12, wherein the gain of the level adjuster is decreased in response to receiving the instruction from the interface.

19. The audio control method according to claim 12, wherein the gain of the level adjuster is decreased to a silent or almost silent state.

20. The audio control method according to claim 12, wherein:

the gain of the level adjuster is decreased at a first rate; and the absolute value of the first rate is less than the absolute value of the change amount of the gain of the level adjuster for the third time period.

* * * * *